(12) United States Patent
Ezzeddine et al.

(10) Patent No.: US 8,797,121 B2
(45) Date of Patent: Aug. 5, 2014

(54) DISTRIBUTED COUPLER WITH FIRST LINE ON SUBSTRATE AND SECOND LINE IN PACKAGE SUPPORTING SUBSTRATE

(75) Inventors: Hilal Ezzeddine, Tours (FR); Claire Laporte, Tours (FR)

(73) Assignee: STMicroelectronics (Tours) SAS, Tours (FR)

( * ) Notice: Subject to any disclaimer, the term of this patent is extended or adjusted under 35 U.S.C. 154(b) by 309 days.

(21) Appl. No.: 13/228,178

(22) Filed: Sep. 8, 2011

(65) Prior Publication Data

US 2012/0062333 A1    Mar. 15, 2012

(30) Foreign Application Priority Data

Sep. 10, 2010  (FR) ...................................... 10 57191

(51) Int. Cl.
*H01P 5/12* (2006.01)
*H01P 3/08* (2006.01)

(52) U.S. Cl.
USPC .......................................... 333/116; 333/109

(58) Field of Classification Search
USPC ..................... 333/116, 104, 19, 115
See application file for complete search history.

(56) References Cited

U.S. PATENT DOCUMENTS

| | | | |
|---|---|---|---|
| 6,542,375 | B1 | 4/2003 | Kuitenbrouwer et al. |
| 2003/0048151 | A1* | 3/2003 | Wang et al. .................. 333/116 |
| 2009/0231057 | A1 | 9/2009 | Sasaki |

OTHER PUBLICATIONS

French Search Report dated Mar. 9, 2011 from corresponding French Application No. 10/57191.

* cited by examiner

*Primary Examiner* — Robert Pascal
*Assistant Examiner* — Kimberly Glenn
(74) *Attorney, Agent, or Firm* — Wolf, Greenfield & Sacks, P.C.

(57) ABSTRACT

A distributed coupler including a first line intended to convey a radio signal between its two ends and a second line intended to sample, by coupling, part of the signal, wherein: one of the lines is formed on an insulating substrate; and the other line is formed in a lead frame supporting the substrate, one line being above the other.

17 Claims, 3 Drawing Sheets

DISTRIBUTED COUPLER WITH FIRST LINE ON SUBSTRATE AND SECOND LINE IN PACKAGE SUPPORTING SUBSTRATE

CROSS REFERENCE TO RELATED APPLICATIONS

This application claims the priority benefit of French patent application number 10/57191, filed on Sep. 10, 2010, entitled PACKAGED COUPLER, which is hereby incorporated by reference to the maximum extent allowable by law.

BACKGROUND OF THE INVENTION

1. Field of the Invention

The present invention generally relates to the electronics industry and, more specifically, to radio transceiver systems. The present invention more specifically relates to the forming of a coupler in a package.

2. Discussion of the Related Art

A coupler is generally used to recover part of the power present on a so-called main or primary transmission line to provide it to another so-called coupled or secondary line, located nearby. Couplers are divided in two categories according to whether they are formed of discrete passive components (lumped element couplers) or of conductive lines close to one another to be coupled (distributed couplers). The present disclosure relates to the second category of couplers. The ports of the main line are generally called IN (input) and OUT (output). Those of the coupled line are generally called CPL (coupled) on the side of terminal IN and ISO (isolated) on the side of terminal OUT.

Distributed couplers are generally made in the form of conductive lines on a thin insulating substrate. Resistive elements forming attenuators may also be integrated with the coupler. Once completed, the assembly is encapsulated in a package provided, for example, with conductive bumps of connection to an electronic circuit board.

When formed on the substrate, the conductive lines of the coupler are generally surrounded with a ground plane.

The present inventors have noticed that this ground plane has an impact on the coupler performance, and especially on its directivity, which corresponds to the difference in transmission loss between ports ISO and CPL, from port IN. Further, the size of the conductive bumps also has an influence upon this performance. The larger the bumps, the poorer the directivity.

SUMMARY OF THE INVENTION

An embodiment provides a coupler overcoming all or part of the disadvantages of usual couplers.

Another embodiment provides a low-bulk coupler.

Another embodiment avoids a degradation of the directivity of a coupler due to the effect of a ground plane.

An embodiment provides a distributed coupler comprising a first line intended to convey a radio signal between its two ends and a second line intended to sample, by coupling, part of said signal, wherein:
one of the lines is formed on an insulating substrate; and
the other line is formed in a lead frame supporting the substrate, one line being above the other.

According to an embodiment, the ends of the second line are connected to resistive attenuators.

According to an embodiment, ground planes are formed approximately above each other on the substrate and in the lead frame.

According to an embodiment, the second line is formed on a first surface of the substrate, which has its other surface above the main line.

According to an embodiment, the second line is formed on a first surface of the substrate, placed via conductive bumps on the lead frame.

The foregoing and other objects, features, and advantages will be discussed in detail in the following non-limiting description of specific embodiments in connection with the accompanying drawings.

DETAILED DESCRIPTION

Figure 1:
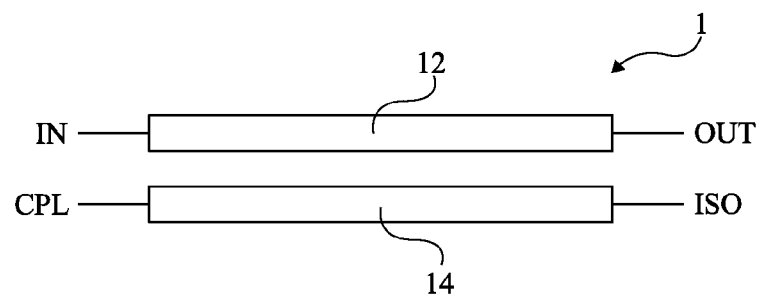
FIG. 1 is a simplified representation of a distributed coupler.

The same elements have been designated with the same reference numerals in the different drawings, which have been drawn out of scale. For clarity, only those elements which are useful to the understanding of the present invention have been shown and will be described. In particular, the different upstream and downstream circuits capable of being connected to the coupler have not been detailed, the present embodiments being compatible with present uses of a coupler in radio transceiver chains. Further, the actual coupler manufacturing steps have not been detailed either, the present embodiments being here again compatible with conventional steps.

FIG. 1 schematically shows a distributed coupler 1. The coupler comprises a main line 12 intended to convey a radio signal (received or transmitted). A so-called input port or access IN is located on the signal reception side (on the amplifier side or on the antenna side according to the transmission direction) while a so-called output port or access OUT (sometimes also called DIR), conversely is on the antenna side or on the receive amplifier side. A coupled or secondary line 14 of coupler 1 samples part of the power of the main line. A port CPL of the coupler corresponds to the end of the secondary line on the side of port IN and provides information relative to the measurement. The other end of the line defines a port ISO.

In the example of FIG. 1, the coupler is symmetrical, that is, the definition of its ports or accesses depends on the external connections.

Figure 2:
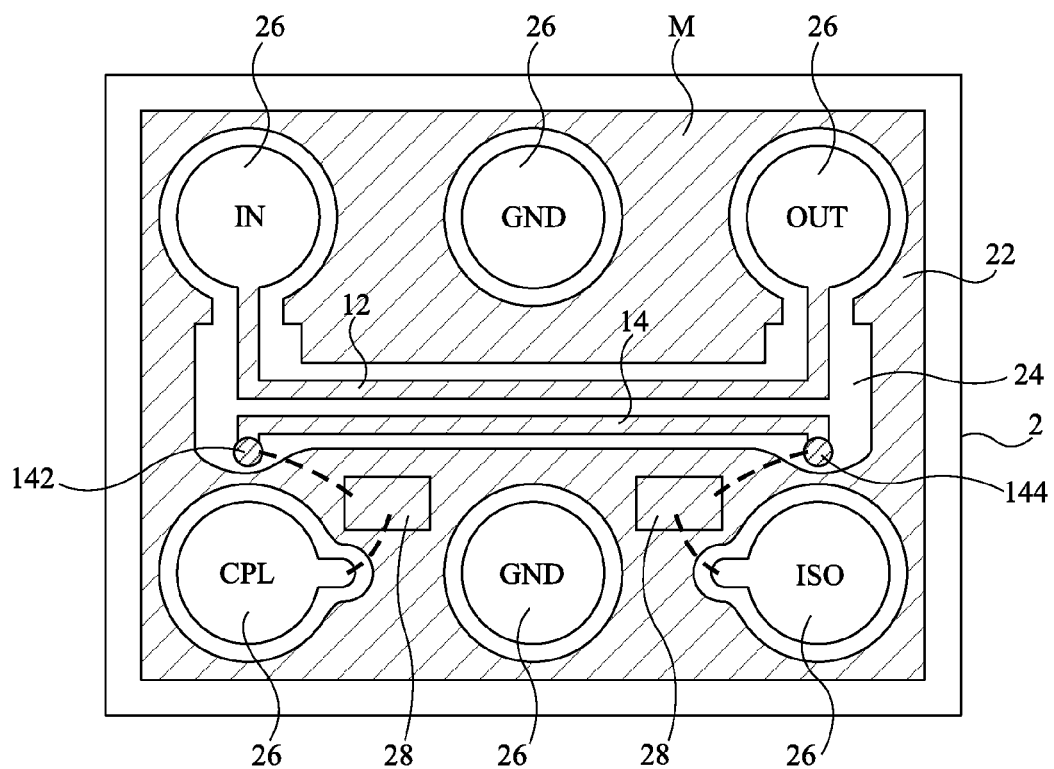
FIG. 2 is a simplified top view of a conductive level placed on a substrate in a usual coupler.

FIG. 2 is a simplified top view of a coupler formed on an insulating substrate 2 by thin layer depositions.

Several conductive levels (a single one of which, 22, is shown in FIG. 2) are stacked with interposed insulating levels on substrate 2. A ground plane M is made in conductive level 22 and respective main and secondary lines 12 and 14 are made in the form of conductive tracks in an opening 24 of the ground plane. Ports IN, OUT, CPL, and ISO are placed on areas 26 where conductive bumps are formed. Ends 142 and 144 of the secondary line are not directly connected to the corresponding pads 26 but are connected thereto via resistive attenuators 28 symbolized by blocks. Such attenuators comprise a connection to respective ends 142 and 144 and to the concerned pads 26 (connections symbolized by dotted lines in FIG. 2) as well as a ground connection.

For simplification, one conductive level has been illustrated in FIG. 2 but it should be noted that in practice, the coupler as a whole generally requires three conductive levels.

Once formed on the insulating substrate, the assembly is encapsulated in a package. The circuit surface area is, in the example of FIG. 2, strongly dependent on the size of conductive bumps 26.

Further, once placed on an electronic circuit board, the coupler most often is at a short distance from a ground plane of this board. This influences the coupler performance and generally necessitates taking into account the final implantation to size the coupler, which is not very convenient.

Figure 3:
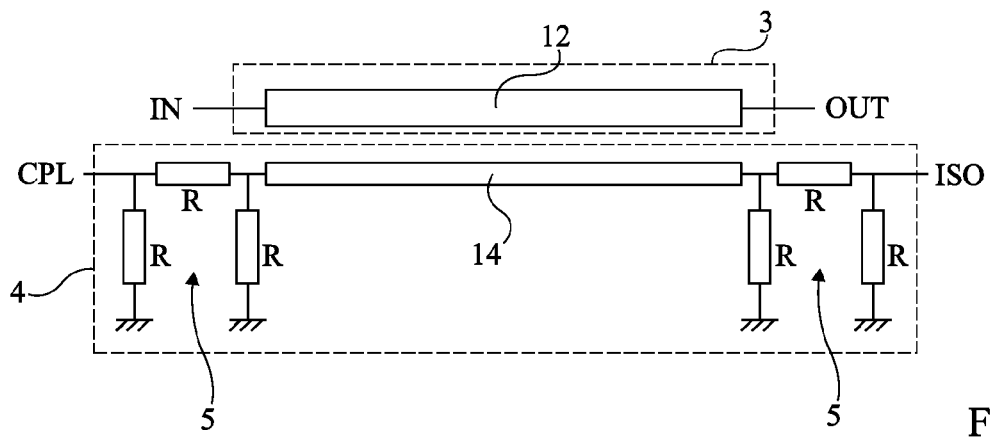
FIG. 3 is a simplified representation of an embodiment of a coupler.

FIG. 3 is a very simplified representation of an embodiment of a packaged coupler.

According to the embodiments which will be described, it is provided to form secondary line 14 of the coupler on an insulating substrate schematically shown with dotted lines 4, and to form main line 12 of the coupler in the package, symbolized by dotted lines 3. The inverse is of course possible.

In the example of FIG. 3, the ends of line 14 are not directly connected to terminals CPL and ISO but are connected thereto via resistive attenuators 5. These attenuators are pi ($\pi$)-pads and each comprise three resistors R. A first one of these resistors connects the end of line 14 respectively to terminal CPL or ISO, while the other two resistors R of each attenuator ground the ends of the first resistor of this attenuator.

Figure 4:
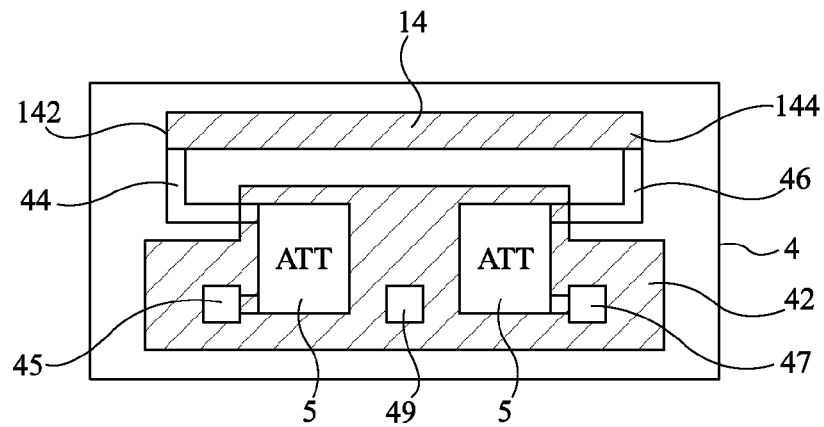
FIG. 4 shows an embodiment of a portion of the coupler of FIG. 3.

FIG. 4 is a simplified top view of an embodiment of the secondary portion of the coupler on an insulating substrate 4. As in the embodiment of FIG. 2, several conductive levels are used to form the different components. In the example of FIG. 4, the secondary line is made in the form of a rectilinear conductive track 14 in a first conductive level. A ground plane 42 is formed simultaneously to line 14 in the surface of substrate 4. Resistive attenuators 5 are formed above ground plane 42. Conductive tracks 44 and 46, not necessarily in the same conductive level, connect respective ends 142 and 144 of track 14 to a first terminal of the respective attenuators. A second terminal of these attenuators is connected to a conductive pad 45 or 47 defining terminals CPL and ISO. A third terminal of the attenuators is connected to ground plane 42. A pad 49 is intended to transfer the ground plane contact to the outside of the package.

The size of the insulating substrate is decreased with respect to a conventional embodiment (FIG. 2), especially because a single one of the coupled lines is formed therein. Further, instead of the large areas for receiving the bumps, only half of the contacts need to be provided.

Figure 5:
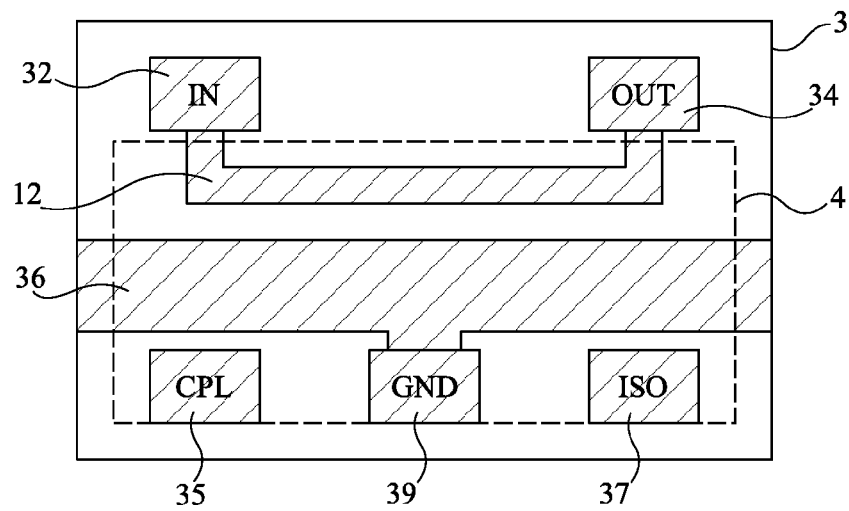
FIG. 5 is a top view of the package of the coupler of FIG. 3.

FIG. 5 is a bottom view of package 3 according to this embodiment. The view of FIG. 5 is arbitrarily said to be a bottom view. It may also be a top view, according to the direction in which the package is placed. The package comprises a conductive track 12 to form the main line of the coupler. The two ends of this track are connected to conductive pads 32 and 34 defining terminals IN and OUT of the coupler. Track 12 is formed to be approximately above track 14 (bulk of substrate 4 illustrated by dotted lines in FIG. 5).

The coupling is thus now vertical instead of being horizontal.

Preferably, a ground plane 36 is formed at the level of track 12, approximately above ground plane 42. Plane 36 is connected to a ground pad 39 also connected by a via to pad 49 of substrate 4. Finally, conductive pads 35 and 37 are formed above pads 45 and 47 to transfer their contacts to the outside of the package.

Preferably, the conductive elements formed at the package level are defined in a lead frame on which substrate 4 is placed when being packaged. The use of such a frame before encapsulation is generally reserved to the forming of a ground plane and of contacting areas. Track 12 is also formed therein.

The present inventors have noticed that a better directivity is obtained when ground planes face each other with as similar a shape as possible in the levels in which the main and secondary lines are formed. In the embodiment of FIGS. 4 and 5, ground plane 36 is symbolized by a line. As a variation, if the ground plane extends around the secondary line, a similar ground plane will be formed in the lead frame.

Figure 6:
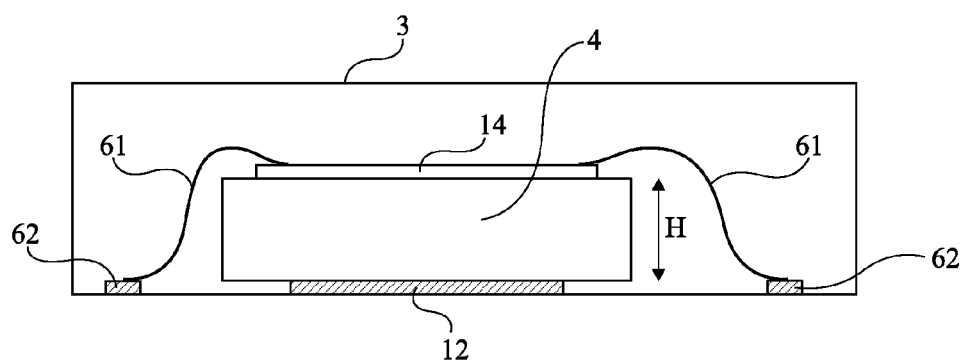
FIG. 6 shows a cross-section view of an embodiment of a packaged coupler.

FIG. 6 is a cross-section view of a first embodiment of the structure illustrated by FIGS. 3 to 5.

FIG. 6 is very simplified and simply illustrates the respective positions of the different elements across the thickness of package 3. In this example, substrate 4 is assumed to have its rear surface (opposite to that on which track 14 is formed) placed on a lead frame. The lead frame comprises areas 62 for receiving leads 61 for transferring the contacts (45, 47, 49, FIG. 4) from the upper surface of substrate 4. Main line 12 can be seen at the lower surface of package 3. In practice, an insulating layer is placed at the lower surface and leaves an access to contacts only. This type of package is for example intended to be placed on a printed circuit board (not shown).

Thickness H of substrate 4 between lines 12 and 14 conditions the directivity of the coupler and is selected according to the impedance of the conductive lines which sets the impedance matching.

Figure 7:
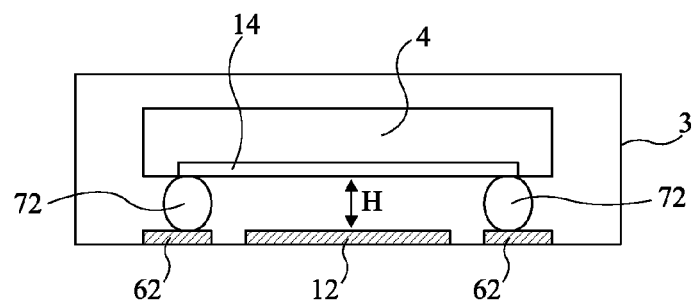
FIG. 7 shows a cross-section view of another embodiment of a packaged coupler.

FIG. 7 shows another embodiment in which substrate 4 defines areas for receiving conductive bumps 72. Substrate 4 is then placed on the lead frame supporting line 12 and contacting areas 62 with its front surface (supporting line 14) facing downwards. The assembly is then encapsulated in a resin to form package 3. Height H is conditioned by the thickness of the conductive bumps.

As a specific example of embodiment, a spacing H of a few hundreds of micrometers between the main and secondary lines provides a good directivity.

An advantage of the described embodiments is to take advantage of the significant differences in the manufacturing thicknesses of an electronic circuit rather than increasing the distances between tracks in the same plane. This enables to spare coupler surface area.

Various embodiments have been described, various alterations and modifications will occur to those skilled in the art. In particular, the practical implementation of the present invention is within the abilities of those skilled in the art based on the functional description given hereabove and on the impedance desired for the coupler. Further, the dimensions of the conductive lines and the values to be given to the resistances may also be adapted according to the application. Moreover, other package structures may be envisaged, provided for the distance between coupled lines to be obtained across the thickness. For example, two substrates each supporting one of the lines (and a ground plane) may be stacked.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A distributed coupler comprising a first line intended to convey a radio signal between its two ends and a second line intended to sample, by coupling, part of said signal, wherein:
   one of the lines is formed on an insulating substrate; and
   the other line is formed in a lead frame supporting the substrate, one line being above the other, wherein ground planes are formed approximately above each other on the substrate and in the lead frame.

2. The coupler of claim 1, wherein ends of the second line are connected to resistive attenuators.

3. The coupler of claim 1, wherein the second line is formed on a first surface of the substrate, which has its other surface above the first line.

4. The coupler of claim 1, wherein the second line is formed on a first surface of the substrate, placed via conductive bumps on the lead frame.

5. A distributed coupler comprising:
   a first conductive line configured to carry a radio frequency signal; and
   a second conductive line configured to carry a part of the radio frequency signal coupled from the first conductive line, one of the first and second conductive lines being formed on a substrate, the other of the first and second conductive lines being formed in a package, and the substrate being mounted in the package such that the first and second conductive lines are positioned for coupling therebetween, wherein the package includes a lead frame and wherein the substrate is mounted on the lead frame.

6. A distributed coupler as defined in claim 5, wherein the substrate is mounted in the package to facilitate vertical coupling between the first and second conductive lines.

7. A distributed coupler as defined in claim 5, wherein the substrate is mounted in the package such that one of the first and second conductive lines is positioned above the other of the first and second conductive lines.

8. A distributed coupler as defined in claim 5, wherein the coupling between the first and second conductive lines is a function of a thickness of the substrate.

9. A distributed coupler as defined in claim 5, wherein the package includes a lead frame having conductive bumps and wherein the substrate is mounted on the conductive bumps.

10. A distributed coupler as defined in claim 9, wherein the coupling between the first and second conductive lines is a function of a thickness of the conductive bumps.

11. A distributed coupler as defined in claim 5, wherein the substrate includes resistive attenuators connected to opposite ends of the second conductive line.

12. A distributed coupler as defined in claim 5, wherein the first conductive line is formed in the package and the second conductive line is formed on the substrate.

13. A distributed coupler comprising:
   a package having a first conductive line formed therein;
   a substrate having a second conductive line formed thereon, wherein the substrate is mounted in the package such that the first and second conductive lines are positioned for radio frequency coupling therebetween, wherein the package includes a lead frame and wherein the substrate is mounted on the lead frame.

14. A method of making a distributed coupler, comprising:
   forming a first conductive line in a package;
   forming a second conductive line on an insulating substrate; and
   mounting the insulating substrate in the package with the first conductive line positioned relative to the second conductive line for radio frequency coupling therebetween, wherein the package includes a lead frame and wherein the insulating substrate is mounted on the lead frame.

15. A method of making a distributed coupler as defined in claim 14, wherein mounting the insulating substrate in the package comprises mounting the insulating substrate in the package such that one of the first and second conductive lines is positioned above the other of the first and second conductive lines.

16. A method of making a distributed coupler as defined in claim 14.

17. A method of making a distributed coupler as defined in claim 14, further comprising forming on the insulating substrate resistive attenuators connected to opposite ends of the second conductive line.

* * * * *